United States Patent
Sadjadpour

(10) Patent No.: US 6,226,773 B1
(45) Date of Patent: May 1, 2001

(54) MEMORY-MINIMIZED ARCHITECTURE FOR IMPLEMENTING MAP DECODING

(75) Inventor: Hamid R. Sadjadpour, West Caldwell, NJ (US)

(73) Assignee: AT&T Corp., New York, NY (US)

( * ) Notice: Subject to any disclaimer, the term of this patent is extended or adjusted under 35 U.S.C. 154(b) by 0 days.

(21) Appl. No.: 09/421,567

(22) Filed: Oct. 20, 1999

(51) Int. Cl.$^7$ ............................................. H03M 7/00
(52) U.S. Cl. ........................ 714/794; 375/341; 714/793
(58) Field of Search ................................. 714/794, 786, 714/793; 371/43; 375/341; 341/107, 143

(56) References Cited

U.S. PATENT DOCUMENTS

| 5,432,803 | * | 7/1995 | Liu et al. ................................. 371/43 |
| 5,721,745 | * | 2/1998 | Hladik et al. .......................... 371/43 |
| 6,028,897 | * | 2/2000 | Wang ................................... 375/265 |
| 6,028,899 | * | 2/2000 | Petersen ............................... 375/341 |
| 6,044,116 | * | 3/2000 | Wang ................................... 375/265 |
| 6,167,552 | * | 12/2000 | Gagnon et al. ....................... 714/793 |

FOREIGN PATENT DOCUMENTS

0123456-A2 * 1/2000 (EP) ................................... 100/100

OTHER PUBLICATIONS

*European Transactions on Telecommunications,* Eurel Publication vol. 8 No. 2 Mar.–Apr. 1997; Patrick Robertson and Peter Hoeher, *Optimal and Sub–Optimal Maximum a Posteriori Algorithms Suitable for Turbo Decoding.*

* cited by examiner

*Primary Examiner*—Michael Tokar
*Assistant Examiner*—John Nguyen

(57) ABSTRACT

The present invention provides a method, computer medium, firmware, and device for minimizing memory requirements for computations for decoding using Maximum Likelihood Probability MAP-based decoding. The method includes the steps of: computing corresponding alpha $\alpha$ values and beta $\beta$ values simultaneously and storing in memory said alpha $\alpha$ values and beta $\beta$ values computed for $\alpha$ at time $k=1,2,\ldots,N/2$ and $\beta$ at time $k=N,\ldots,(N/2)+1$; and computing soft output data for alpha at time $k=(N/2)+i$ and beta at time $(N/2)-i+1$, i being a positive integer, for $N \geq \alpha > N/2$ and $1 \leq \beta \leq N/2$, wherein $\alpha$ and $\beta$ are parameter values computed by forward and backward recursion, respectively, based on transition probabilities of a selected channel and on input binary data at discrete time k and a parity bit corresponding to one of: a first recursive systematic convolutional encoder and a second recursive systematic convolutional encoder.

7 Claims, 3 Drawing Sheets

MEMORY-MINIMIZED ARCHITECTURE FOR IMPLEMENTING MAP DECODING

FIELD OF THE INVENTION

The present invention relates to Parallel (Turbo codes) or Serial Concateneated Convolutional codes. More specifically, the present invention relates to the architecture for implementing parallel or serial concatenated convolutional codes for MAP-based decoding algorithms. Both parallel and serial concatenated convolutional codes are referred to as Turbo codes for simplicity.

BACKGROUND OF THE INVENTION

In all different types of MAP-based (Maximum A Posteriori probability) algorithms, the decoding of the MAP parameters, i.e., $a_k$ and $B_k$ parameters, that represent probabilities of the states of the trellis at time k conditioned on the past received signals and the probabilities of the trellis states at time k conditioned on the future received signals, respectively, is determined in a forward and backward recursion. As shown in FIG. 1, after computation (102) of $\gamma_j(R_k,s',s)$, alpha and beta parameters for all N data bits are computed (104, 108) and stored (106, 110) in memory, where N is a preselected integer. Then the conditional joint probability $\Gamma_i$ is computed (112) based on the N values for alpha and the N values for beta. This approach requires storing all the information related to alpha and beta information for the entire data block. The MAP decoding algorithm is described in more detail below.

The MAP decoding algorithm is a recursive technique that computes the Log-Likelihood Ratio (LLR) as:

$$\Lambda_1(d_k) = \log \frac{\sum_s \sum_{s'} r_1(R_k, s', s) a_{k-1}(s') \beta_k(s)}{\sum \sum r_o(R_k, s', s) a_{k-1}(s') \beta_k(s)} \quad (1)$$

where $R_k = \{d_k^r, y_k^n\}$ and s' and s are the previous and current states of the system. $d_k^r$ and $y_k^n$ are the received data and parity bit from the i-th encoder. $\alpha_k(s)$ and $\beta_k(s)$ are computed recursively as:

$$a_k(s) = h_\alpha \sum_{s'} \sum_{j=0}^{1} r_j(R_k, s', s) a_{k-1} \quad (2)$$

$$\beta_k(s) = h_\beta \sum_{s'} \sum_{j=0}^{1} r_j(R_k, s', s) \beta_{k+1} \quad (3)$$

where $h_\alpha$ and $h_\beta$ are normalization factors. $\gamma_j(R_k,s',s)$ is computed from transition probabilities of the channel, and here the channel is assumed to be a discrete Gaussian memoryless channel. $\gamma_j(R_k,s',s)$ is described as:

$$\gamma_j(R_k,s',s) = \Pr\{R_k|d_k=j, S_k=s, S_{k-1}=s'\} \times \Pr\{d_k=j|S_k=s, S_{k-1}=s'\} \times \Pr\{S_k=s |S_{k-1}=s'\} \quad (4)$$

The second term in (4) is the transition probability of the discrete channel; the third term is equal to 1 or 0 depending on whether it is possible to go from state s' to state s when the input data is j; and the fourth term is the transition state probabilities and, for equiprobable binary data, it is equal to ½. Considering $R_k = \{u_k^r, y_k^{ri}\}$, $u_k^r$ and $y_k^{ri}$ are two uncorrelated Gaussian variables conditioned on $(d_k=j, S_k=s, S_{k-1}=s')$, therefore, the second term in (4) may be divided into two terms:

$$\Pr\{R_k|\ldots\} = \Pr\{u_k^r|\ldots\} \times \Pr\{y_k^{ri}|\ldots\}$$

If the Turbo block length is equal to N, all N data and parity bits must be received before the beta parameters are computed. Then, the backward recursion may be used to compute beta parameters using equation (3) above. Since the final soft output decoded data are computed using equation (1), all alpha and beta parameters for the entire data sequence are retained to finish the computations. If the memory length of recursive systematic convolutional (RSC) codes in Turbo code is equal to m, then a total of $2^m$ states exist for each decoder. Therefore, a total of $2^m N$ memory space is required for keeping the alpha or beta parameters. Also, the decoded data will be available at the end after finishing computation of alpha and beta parameters and using equation (1).

Thus, there is a need for a method, computer medium and device that minimize memory is requirements for computing MAP-based decoding algorithms.

SUMMARY OF THE INVENTION

The present invention minimizes the memory requirements to compute MAP-based decoding algorithms. The architecture used to implement the present invention minimizes the memory requirement for alpha and beta by a factor of 2. Since N, the Turbo block length, is usually a large number in Turbo codes, the architecture of the present invention provides a significant reduction in hardware requirements. The present invention may be implemented by software, firmware, or hardware; for example, hardware that may be utilized to implement the present invention includes, but is not limited to, an integrated circuit, a microprocessor, or an ASIC (application-specific integrated circuit) such as a VLSI chip that is presently being built by MITEL corporation.

DETAILED DESCRIPTION OF PREFERRED EMBODIMENTS

Figure 1:
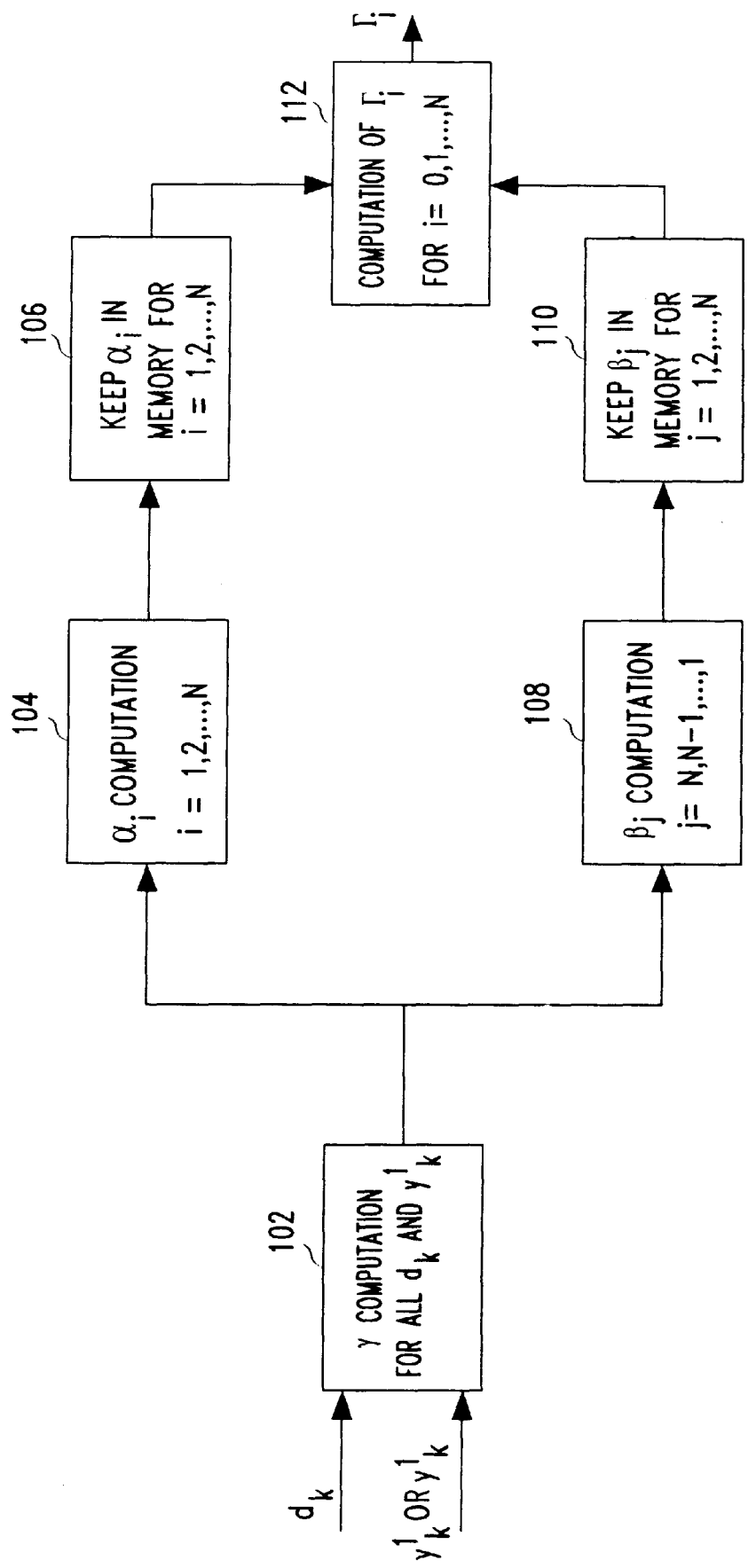
FIG. 1 is a flow chart showing steps for computing MAP-based decoding algorithms as is known in the art.
Figure 2:
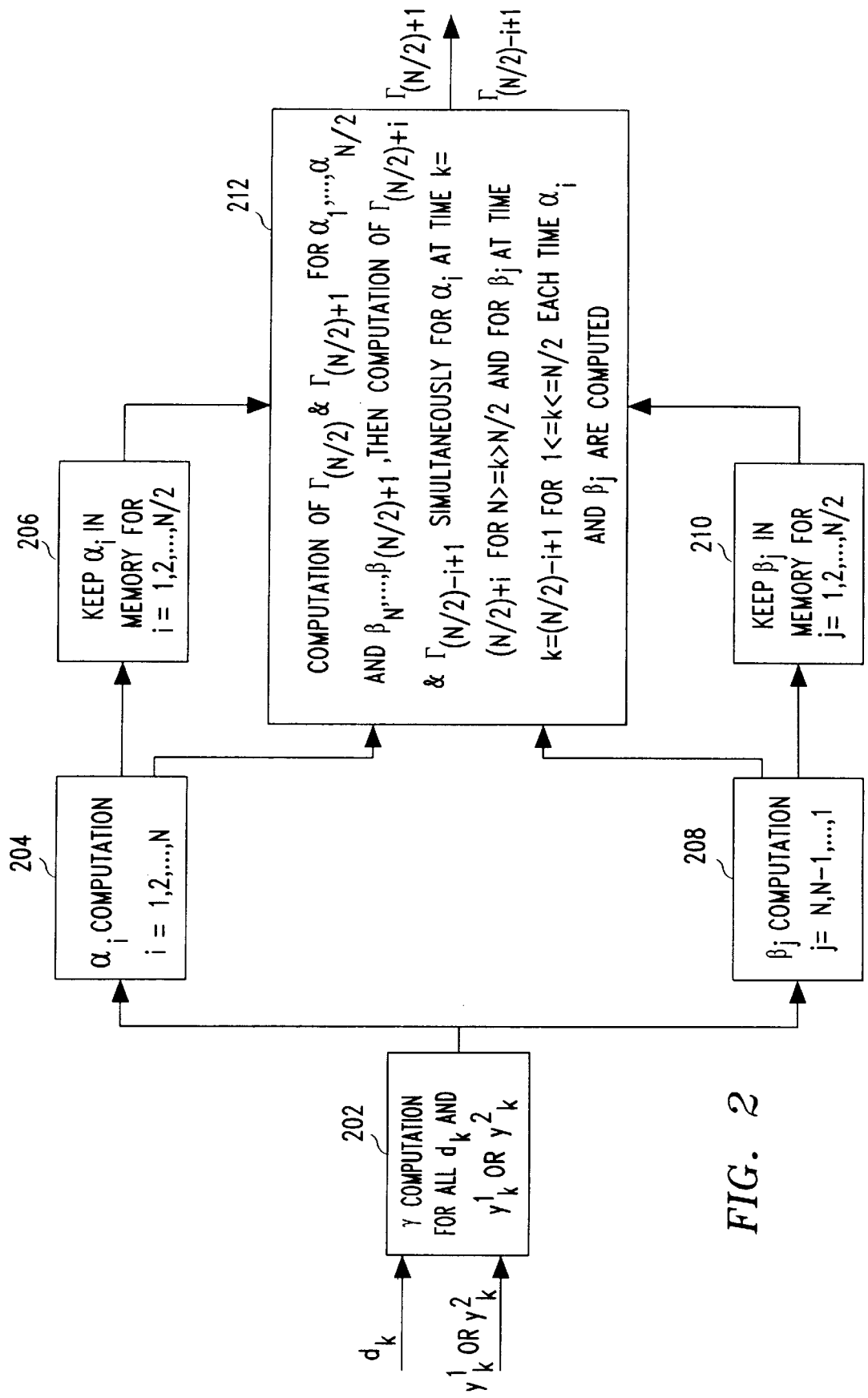
FIG. 2 is a flow chart showing one embodiment of steps for computing MAP-based decoding algorithms in accordance with the present invention.

As shown in FIG. 2, after computation (202) of $\gamma_j(R_k,s',s)$ transition probabilities of the channel, the parameters alpha (204) and beta (208) are computed. The alpha and beta parameters are stored in memory (206, 210), and then the soft output values of the estimated data sequence are computed (212).

Each recursive systematic convolutional (RSC) encoder consists of m memory elements; at each clock cycle, $\alpha_k(s)$ and $\beta_{n-k+1}(s)$ parameters are computed simultaneously using $2^m$ parallel hardware for all values of s=1, ..., $2^m$ and $1 \leq k \leq N/2$. All of the values of $\alpha_k(s)$ and $\beta_{N-k+1}(s)$ are stored in memory. For $(N/2)+1 \leq k \leq N$, at each clock cycle that $2^m$ values for $\alpha_k(s)$ and $\beta_{N-k+1}(s)$ are computed, equation (1) is used to compute $\Lambda_1(d_k)$. Clearly, $\Lambda_1(d_k)$ is first computed for k=N/2 and (N/2)+1; and after that, at each clock cycle that $\alpha_k(s)$ and $\beta_{N-k+1}(s)$ parameters are computed, $\Lambda_1(d_k)$ and $\Lambda_1(d_{N-k+1})$ are immediately computed. The values of $\alpha_k(s)$ and $\beta_{N-k+1}(s)$ parameters for $N/2+1 \leq k \leq N$ are not stored any longer since it is no longer necessary to save them. With the present invention, the memory requirements for $\alpha_k(s)$ and $\beta_k(s)$ computation are reduced from $2^m \cdot N$ to $2^{m-1} \cdot N$. In many applications with Turbo code, N is a large number. Thus, the present invention provides a significant reduction in memory requirements for MAP-based decoding algorithms. In addition, the present invention allows a parallel architecture for MAP-based decoding algorithms to be utilized. Another advantage of the present invention is the fact that the soft output decoding for each iteration is immediately available after computation of $\alpha_k(s)$ and $\beta_k(s)$ parameters with minimum hardware requirements.

There are M states for each convolutional encoder with m shift registers; then $M=2^m$, i.e., for each alpha and beta there are M different values at each time k. In the prior art, alpha is computed from time k=1 up to k=N. When alpha has been computed, then beta was computed from time k=N down to k=1. Then the soft output for the decoder was computed.

Figure 3:
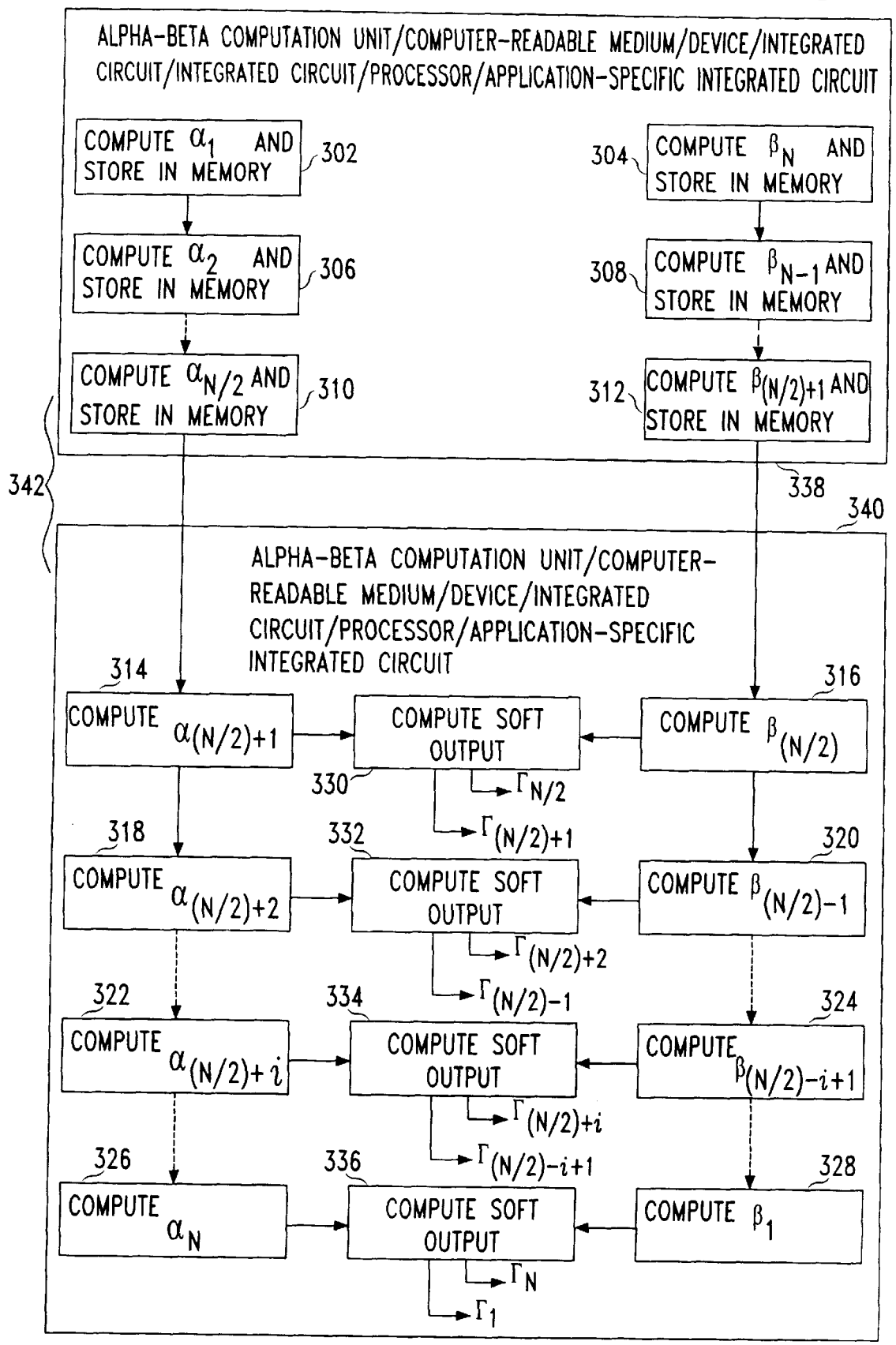
FIG. 3 is a flow chart/block diagram showing one embodiment of steps in accordance with the method, firmware, device and computer medium of the present invention.

In contrast, as shown in FIGS. 2 and 3, in the present invention, first the data is received. $d_k$ is the input binary data at discrete time k. $y^1_k$ and $y^2_k$ are parity bits corresponding to the first and the second RSC encoders, respectively. Following computation of $\gamma_j(R_k,s',s)$ (202) transition probabilities of the channel, the alpha at time k=1 (302) and beta at time k=N (304) are computed simultaneously and stored in memory. Then alpha at time k=2 (306) and beta at k=N−1 (308) are computed simultaneously and stored in memory. This process is continued up to k=N/2, where alpha for N/2 (310) and beta for k=(N/2)+1 (312) are computed. Then, each time alpha at time (N/2)+i (314, 318, 322, 326) and beta at time (N/2)−i+1 (316, 320, 324, 328) are computed, the soft output data $\Gamma_{(N/2)+i}$ and $\Gamma_{(N/2)-i+1}$ are also computed ($\Gamma_{N/2}$ and $\Gamma_{(N/2)+1}$) at 330, $\Gamma_{(N/2)+2}$ and $\Gamma_{(N/2)-1}$ at 332, $\Gamma_{(N/2)+i}$ and $\Gamma_{(N/2)-i+1}$ at 334, $\Gamma_N$ and $\Gamma_1$ at 336) where i is a positive integer.

A device (342) for minimizing memory requirements for computations for decoding using Maximum Likelihood Probability MAP-based decoding in accordance with the present invention, also shown in FIG. 2, includes: an alpha-beta computation unit (338) for computing corresponding alpha $\alpha$ values and beta $\beta$ values simultaneously and storing said alpha $\alpha$ values and beta $\beta$ values for k=1, . . . , N/2 and k=N, . . . , (N/2)+1, respectively; and an alpha-beta-soft output computation unit (340), coupled to the alpha-beta computation unit (338), for computing alpha $\alpha$ values for $N \geq k > N/2$ and beta $\beta$ values for $1 \leq k \leq N/2$ and a pair of soft output values corresponding to said alpha $\alpha$ values for $N \geq k \geq N/2$ and beta $\beta$ values for 1 is $\leq k \leq N/2$, wherein alpha $\alpha$ values and beta $\beta$ values are parameter values computed by forward and backward recursion, respectively, based on $\gamma_j(R_k,s',s)$, which is determined based on transition probabilities of a selected channel. Alternatively, the device may include an integrated circuit, include a processor, include an application-specific integrated circuit, or may include a computer medium having computer-executable instructions for implementing at least part of a function of the computer unit/units.

It should be understood that the foregoing description is only illustrative of the invention. Various alternatives, equivalents and modifications can be devised by those skilled in the art without departing from the invention. Accordingly, the present invention is intended to embrace all such alternatives, equivalents, modifications and variances which fall within the scope of the appended claims.

What is claimed is:

1. A method for minimizing memory requirements for computations for decoding using Maximum Likelihood Probability MAP-based decoding, comprising the steps of:

computing corresponding alpha $\alpha$ values and beta $\beta$ values simultaneously and storing said alpha $\alpha$ values and beta $\beta$ values computed for $\alpha$ at time k=1,2, . . . , N/2 and $\beta$ at time k=N, . . . , (N/2)+1; and computing soft output data for alpha at time k=(N/2)+i and beta at time (N/2)−i+1, i being a positive integer, for $N \geq \alpha > N/2$ and $1 \leq \beta \leq N/2$, wherein $\alpha$ and $\beta$ are parameter values computed by forward and backward recursion, respectively, based on transition probabilities of a selected channel and on input binary data at discrete time k and a parity bit corresponding to one of: a first recursive systematic convolutional encoder and a second recursive systematic convolutional encoder.

2. A computer-readable medium having computer-executable instructions for performing the steps recited in claim 1.

3. A device for minimizing memory requirements for computations for decoding using Maximum Likelihood Probability MAP-based decoding, comprising:

an alpha-beta computation unit, for computing corresponding alpha $\alpha$ values and beta $\beta$ values simultaneously and storing said alpha $\alpha$ values and beta $\beta$ values for k=1, . . . , N/2 and k=N, . . . , (N/2)+1, respectively; and an alpha-beta-soft output computation unit, coupled to the alpha-beta computation unit, for computing alpha $\alpha$ values for $N \geq k > N/2$ and beta $\beta$ values for $1 \leq k \leq N/2$ and a pair of soft output values corresponding to said alpha $\alpha$ values for $N \geq k > (N/2)$ and beta $\beta$ values for $1 \leq k \leq N/2$, wherein alpha $\alpha$ values and beta $\beta$ values are parameter values computed by forward and backward recursion, respectively, based on $\gamma_j(R_k,s',s)$, which is determined based on transition probabilities of a selected channel, an alpha-beta computation unit for computing corresponding alpha $\alpha$ values and beta $\beta$ values simultaneously and storing said alpha $\alpha$ values and said beta $\beta$ values for $\alpha$=1, . . . , N/2 and $\beta$=N, . . . , (N/2)+1; and an alpha-beta-soft output computation unit, coupled to the alpha-beta computation unit, for computing alpha $\alpha$ values and beta $\beta$ values for $N \geq \alpha > N/2$ and $1 \leq \beta \leq N/2$ and a pair of soft output values corresponding to said alpha $\alpha$ values and said beta $\beta$ values for $N \geq \alpha > N/2$ and $1 \leq \beta \leq N/2$, wherein said alpha $\alpha$ values and said beta $\beta$ values are parameter values computed by forward and backward recursion based on transition probabilities a selected channel, and on input binary data at discrete time k and a parity bit corresponding to one of: a first recursive systematic convolutional encoder and a second recursive systematic convolutional encoder.

4. The device of claim 3 wherein at least one of the computation units comprises an integrated circuit.

5. The device of claim 3 wherein at least one of the computation units comprises a processor.

6. The device of claim 3 wherein at least one of the computation units comprises application-specific integrated circuit.

7. The device of claim 3 wherein at least one of the computation units includes a computer medium having computer-executable instructions for implementing at least part of a function of the computer unit/units.

* * * * *